(12) United States Patent
Ishibashi et al.

(10) Patent No.: US 7,737,509 B2
(45) Date of Patent: Jun. 15, 2010

(54) SEMICONDUCTOR INTEGRATED CIRCUIT DEVICE

(75) Inventors: Koichiro Ishibashi, Warabi (JP); Kenichi Osada, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 10 days.

(21) Appl. No.: 12/216,716

(22) Filed: Jul. 10, 2008

(65) Prior Publication Data

US 2009/0010042 A1    Jan. 8, 2009

Related U.S. Application Data

(63) Continuation of application No. 11/188,735, filed on Jul. 26, 2005, now Pat. No. 7,408,231, which is a continuation of application No. 10/731,152, filed on Dec. 10, 2003, now Pat. No. 6,953,975, which is a continuation of application No. 10/300,747, filed on Nov. 21, 2002, now Pat. No. 6,683,353, which is a continuation of application No. 10/109,669, filed on Apr. 1, 2002, now Pat. No. 6,563,180, which is a continuation of application No. 09/987,820, filed on Nov. 16, 2001, now Pat. No. 6,424,015, which is a continuation of application No. 09/604,513, filed on Jun. 27, 2000, now abandoned.

(30) Foreign Application Priority Data

Jun. 29, 1999    (JP) .................................. 11-182902

(51) Int. Cl.
    *H01L 27/088*    (2006.01)
(52) U.S. Cl. .............................. 257/392; 257/E29.264; 257/E29.135
(58) Field of Classification Search .................. 257/391, 257/392, E29.264
See application file for complete search history.

(56) References Cited

U.S. PATENT DOCUMENTS

| | | | |
|---|---|---|---|
| 5,212,663 A | 5/1993 | Leong | |
| 5,668,035 A * | 9/1997 | Fang et al. | ................... 438/239 |
| 6,215,159 B1 | 4/2001 | Fujita et al. | |
| 6,326,260 B1 * | 12/2001 | Divakaruni et al. | ......... 438/241 |
| 6,356,484 B2 | 3/2002 | Dosaka et al. | |
| 6,410,387 B1 * | 6/2002 | Cappelletti et al. | .......... 438/257 |

(Continued)

FOREIGN PATENT DOCUMENTS

JP    10-65517    3/1998

(Continued)

*Primary Examiner*—Kenneth A Parker
*Assistant Examiner*—Paul A Budd
(74) *Attorney, Agent, or Firm*—Mattingly & Malur, P.C.

(57) ABSTRACT

In an integrated circuit device, there are various optimum gate lengths, thickness of gate oxide films, and threshold voltages according to the characteristics of circuits. In a semiconductor integrated circuit device in which the circuits are integrated on the same substrate, the manufacturing process is complicated in order to set the circuits to the optimum values. As a result, in association with deterioration in the yield and increase in the number of manufacturing days, the manufacturing cost increases. In order to solve the problems, according to the invention, transistors of high and low thresholds are used in a logic circuit, a memory cell uses a transistor of the same high threshold voltage and a low threshold voltage transistor, and an input/output circuit uses a transistor having the same high threshold voltage and the same concentration in a channel, and a thicker gate oxide film.

5 Claims, 15 Drawing Sheets

| | logic circuit | | SRAM | | | DRAM | IO |
|---|---|---|---|---|---|---|---|
| | about 90% | about 10% | load MOS | transter MOS | drive MOS | Tr MOS | |
| threshold voltage NMOS PMOS | high Vth ( 0.45V) (−0.45V) | low Vth ( 0.35V) (−0.35V) | high Vth ( 0.35V) (−0.45V) | low Vth ( 0.35V) | high Vth ( 0.45V) | high Vth ( 0.65V) | high Vth ( 0.65V) (−0.65V) |
| gate oxide | thin gate oxide (3.2nm) | | thin gate oxide (3.2nm) | | | thick gate oxide (6.5nm) | thick gate oxide (6.5nm) |
| supply voltage | low voltage (1.5V) | | low voltage (1.5V) | | | high voltage (2.5V) | high voltage (2.5V) |
| gate length | long channel (0.18um) | short channel (0.14um) | long channel (0.18um) | short channel (0.14um) | long channel (0.18um) | long channel (0.18um) | long channel (0.14um) |
| circuitry | | | | | | | | value in parentheses is an example thin low threshold-voltage
thin high threshold-voltage
thick high threshold-voltage

U.S. PATENT DOCUMENTS

| | | | |
|---|---|---|---|
| 6,583,011 B1 * | 6/2003 | Xia et al. | 438/275 |
| 6,683,353 B2 | 1/2004 | Ishibashi et al. | |
| 6,794,709 B2 * | 9/2004 | Ahn et al. | 257/315 |
| 6,953,975 B2 | 10/2005 | Ishibashi et al. | |

FOREIGN PATENT DOCUMENTS

| | | | |
|---|---|---|---|
| JP | 10-242292 | * | 3/1998 |
| JP | 10-242292 | | 9/1998 |
| JP | 2000-277627 | * | 10/2000 |

* cited by examiner

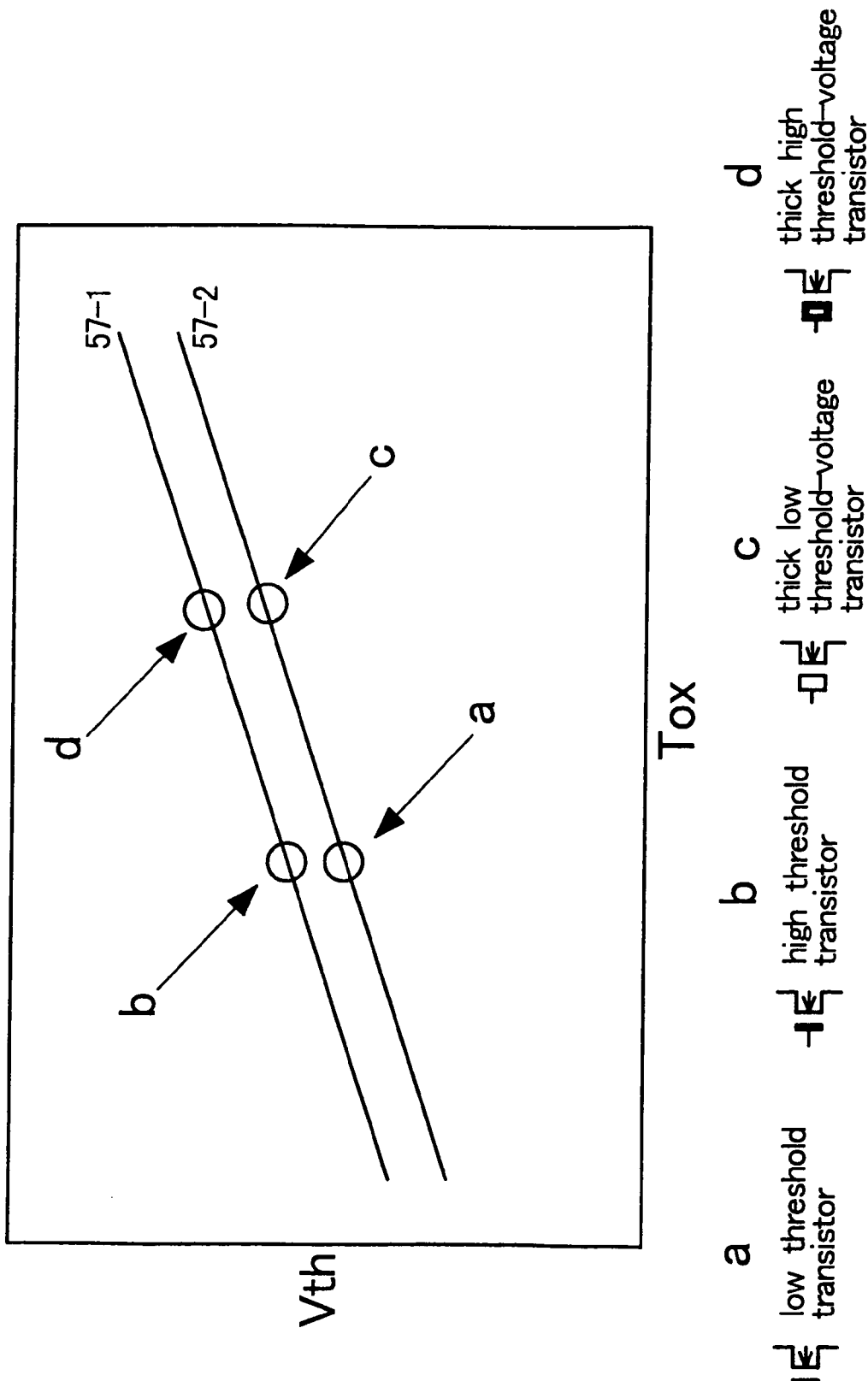

thick low threshold-voltage transistor

FIG.8

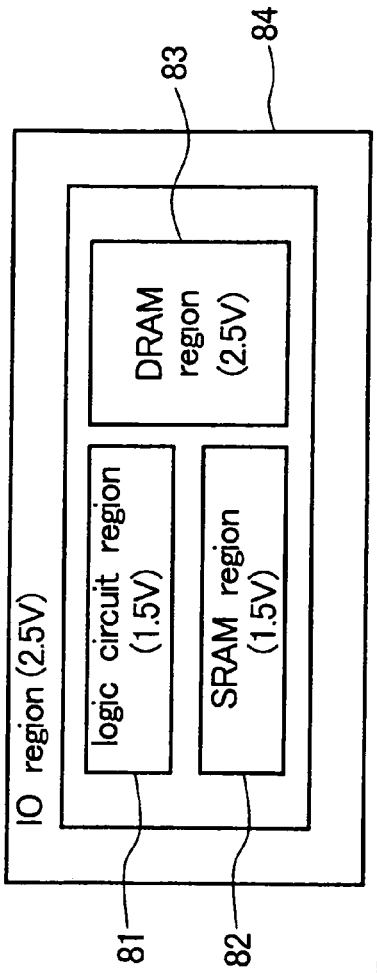

| | logic circuit | | SRAM | | | DRAM | IO |
|---|---|---|---|---|---|---|---|
| | about 90% | about 10% | transfer MOS | drive MOS | load MOS | Tr MOS | |
| threshold voltage NMOS PMOS | high Vth (0.45V) (-0.45V) | low Vth (0.35V) (-0.35V) | low Vth (0.35V) | high Vth (0.45V) | high Vth (-0.45V) | high Vth (0.65V) | high Vth (0.65V) (-0.65V) |
| gate oxide | thin gate oxide (3.2nm) | thin gate oxide (3.2nm) | thin gate oxide (3.2nm) | | | thick gate oxide (6.5nm) | thick gate oxide (6.5nm) |
| supply voltage | low voltage (1.5V) | low voltage (1.5V) | low voltage (1.5V) | | | high voltage (2.5V) | high voltage (2.5V) |
| circuitry | | | | | | | | value in parentheses is an example thin low threshold-voltage thin high threshold-voltage thick high threshold-voltage

FIG.12

| | logic circuit | | load MOS | SRAM | | DRAM | IO |
| --- | --- | --- | --- | --- | --- | --- | --- |
| | about 90% | about 10% | | transfer MOS | drive MOS | Tr MOS | |
| threshold voltage NMOS PMOS | high Vth (0.45V) (−0.45V) | low Vth (0.35V) (−0.35V) | high Vth (−0.45V) | low Vth (0.35V) | high Vth (0.45V) | high Vth (0.65V) | high Vth (0.65V) (−0.65V) |
| gate oxide | thin gate oxide (3.2nm) | | | thin gate oxide (3.2nm) | | thick gate oxide (6.5nm) | thick gate oxide (6.5nm) |
| supply voltage | low voltage (1.5V) | | | low voltage (1.5V) | | high voltage (2.5V) | high voltage (2.5V) |
| gate length | long channel (0.18um) | short channel (0.14um) | long channel (0.18um) | short channel (0.14um) | long channel (0.18um) | long channel (0.18um) | long channel (0.14um) |
| circuitry | 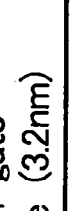 | 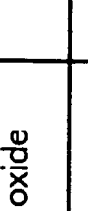 | | 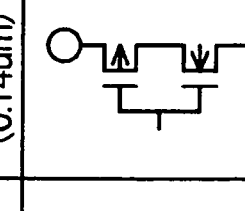 | | 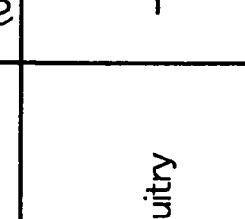 | 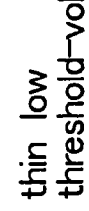 | value in parentheses is an example

 thin low threshold-voltage

 thin high threshold-voltage

 thick high threshold-voltage

FIG.14
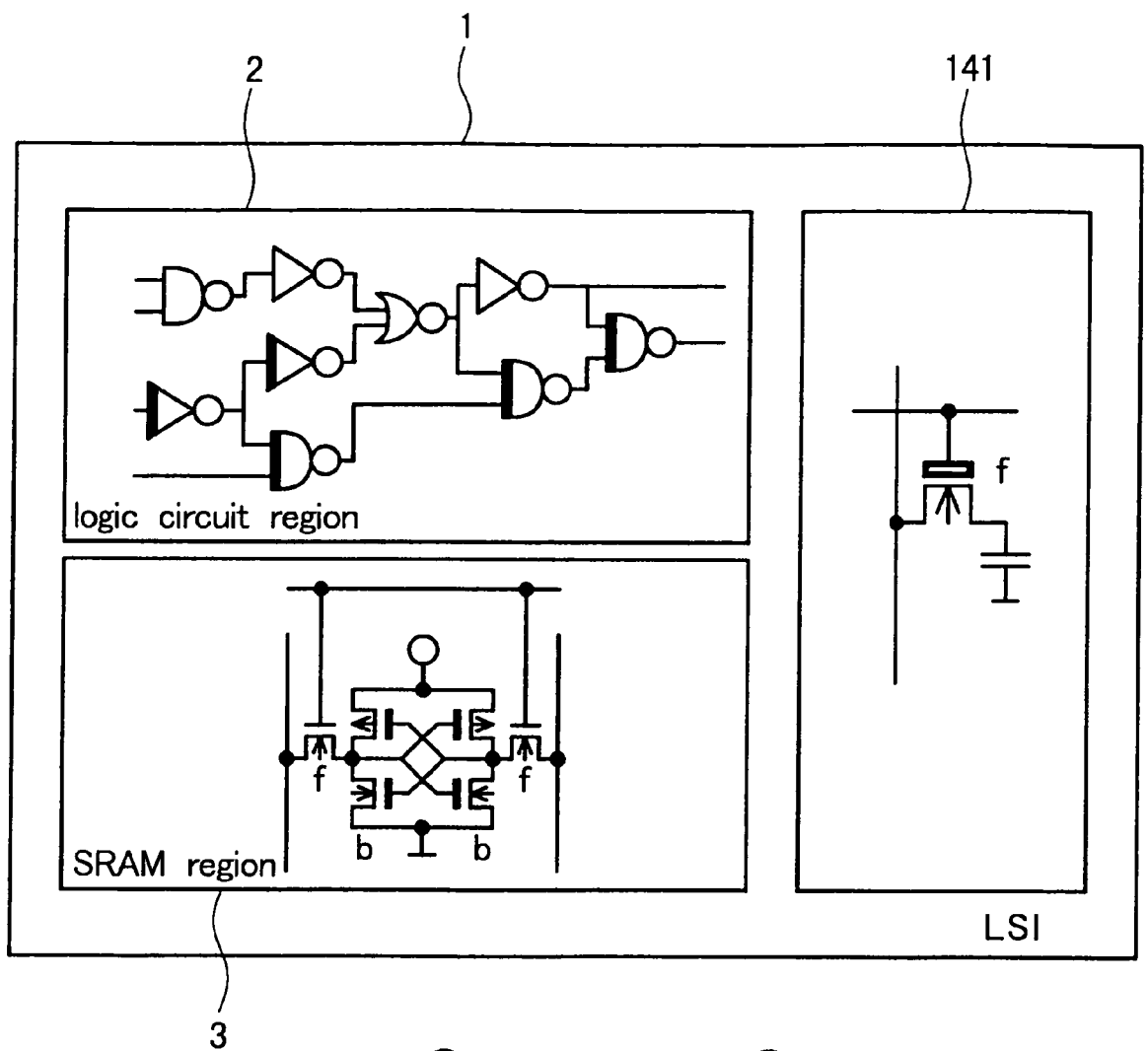
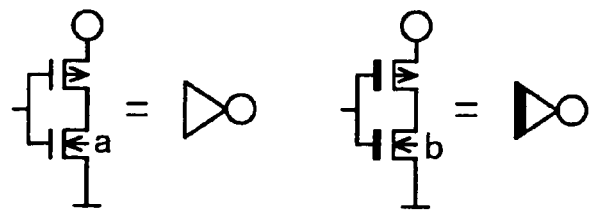

SEMICONDUCTOR INTEGRATED CIRCUIT DEVICE

This is a continuation application of U.S. Ser. No. 11/188,735, filed Jul. 26, 2005, now U.S. Pat. No. 7,408,231 which is a continuation application of U.S. Ser. No. 10/731,152, filed Dec. 10, 2003, now U.S. Pat. No. 6,953,975; which is a continuation application of U.S. Ser. No. 10/300,747, filed Nov. 21, 2002, now U.S. Pat. No. 6,683,353; which is a continuation application of U.S. Ser. No. 10/109,669, filed Apr. 1, 2002, now U.S. Pat. No. 6,563,180; which is a continuation application of U.S. Ser. No. 09/987,820, filed on Nov. 16, 2001, now U.S. Pat. No. 6,424,015; which is a continuation of U.S. Ser. No. 09/604,513, filed Jun. 27, 2000, abandoned.

FIELD OF THE INVENTION

The present invention relates to a semiconductor integrated circuit device using a CMOS and, more particularly, to a technique for realizing a semiconductor integrated circuit device in which a logic circuit and a memory are formed on the same substrate without complicating a manufacturing process.

BACKGROUND OF THE INVENTION

A conventional technique of increasing the operating speed of a logic circuit is disclosed in JP-Laid Open No. Hei10-65517. In the conventional technique, while improving the operating speed by using a transistor of a low threshold voltage in a signal path for determining the operating speed or what is called a critical path, a leakage current is reduced by using transistors of middle or high threshold voltages for the other signal paths.

The enhancement of performance of an integrated circuit device using a CMOS has been realized by enhancement of performance and increase in packing density of transistors by making the gate in each of NMOS and PMOS transistors finer and reducing the thickness of a gate oxide film. In association with the enhancement, the supply voltage has been also decreased so that the electric field intensity is not increased by the finer gate and thinner film. For example, in the generation of a gate length of 0.35 µm as a typical example in industry, the supply voltage is 3.3V. On the other hand, in the generation of the gate length of 0.25 µm, the supply voltage is 2.5V.

Since further decrease in the supply voltage in association with the finer gate in the future is expected, if the threshold voltage is not decreased as well, the operating speed of the integrated circuit largely deteriorates. When the threshold voltage is decreased, however, a subthreshold current increases and the leakage current increases. In the conventional technique, consequently, a method of setting three threshold voltages for a logic circuit and decreasing the threshold of a transistor in a circuit in especially a signal path which determines the operating speed is employed. In the conventional technique, however, since three threshold values are created, the manufacturing method is complicated.

On the other hand, the scale of an integrated circuit device in recent years is becoming greater. Not only a logic circuit but also circuits such as a considerably large-scaled memory, an input output interface, a PLL and a clock are mounted on a chip.

Such circuits have, however, different characteristics and the characteristics of transistors required according to the characteristics of the circuits vary. For example, the threshold of a memory cell of an SRAM comprising six transistors, which is used together with a logic circuit cannot be decreased to a certain voltage or lower in order to realize electric stability. When the threshold of a memory cell in a DRAM comprising a capacitor and a transistor is decreased, charges accumulated in the capacitor are discharged by a leakage of the transistor. Consequently, the threshold cannot be decreased to a certain voltage or lower. The input and output voltages are determined by a specification and are higher than the internal operating voltage. An input output interface circuit inserted between them is therefore required to have the channel length and a gate oxide film which can stand at a high withstand voltage.

The optimum gate length, gate oxide film and threshold voltage vary according to the characteristics of the circuits in the integrated circuit device. When a semiconductor integrated circuit device in which the circuits are integrated on the same substrate is manufactured in accordance with the characteristics of the respective circuits, the manufacturing process is complicated. It is therefore feared that the manufacturing cost increases in association with deterioration in yield and increase in the number of manufacturing days.

The present invention provides a semiconductor integrated circuit device means capable of manufacturing even a semiconductor integrated circuit device in which the supply voltage to the logic circuit is low and various kinds of circuits exist on the same substrate at low cost without complicating the manufacturing process.

SUMMARY OF THE INVENTION

In order to solve the problems, according to the invention, there is provided a semiconductor integrated circuit device comprising: a logic circuit; and a memory cell array on which memory cells are integrated, wherein the logic circuit has; a first logic gate including an NMOS transistor having a first threshold voltage and a PMOS transistor having a third threshold voltage; and a second logic gate including an NMOS transistor having a second threshold voltage and a PMOS transistor having a fourth threshold voltage, the memory cell array is a memory cell array on which a static memory cell comprising two load MOS transistors, two drive MOS transistors, and two transfer MOS transistors is integrated, the two load MOS transistors are PMOS transistors each having the fourth threshold voltage, the two drive MOS transistors are NMOS transistors each having the second threshold voltage, the first threshold voltage is smaller than the second threshold voltage, and the absolute value of the third threshold voltage is smaller than the absolute value of the fourth threshold voltage. The logic circuit and the SRAM memory cell are designed so as to satisfy the conditions.

In the invention, the logic circuit uses transistors of high and low thresholds, a high threshold transistor is used as at least the drive MOS transistor in the SRAM memory cell and a high threshold transistor having a thicker gate oxide film with the same dose of impurities in a channel is used as the transfer MOS transistor in the DRAM memory cell, and the input output circuit uses a transistor having a thicker gate oxide film with either the impurity concentration at the time of the high threshold or the impurity concentration at the time of the low threshold. By the means, the transistors optimum for the respective circuits can be manufactured without increasing the number of processes.

The logic circuit in the specification denotes a circuit region in which a combination of logic gates is provided except for the memory cell array, and comprises a data path including a register file and an execution unit and a control logic. The high (low) threshold denotes a high (low) threshold of which absolute value is high in the PMOS transistor. Generally, the threshold of the PMOS transistor and that of the NMOS transistor are different from each other. The high and low thresholds denotes high and low thresholds in each type of the channels.

BRIEF DESCRIPTION OF THE DRAWINGS

FIG. 5 is a diagram showing the relation between the threshold voltage and thickness of a gate oxide film.

FIG. 8 shows a logic circuit, an SRAM array, a DRAM array, and an IO circuit which are mounted on the same substrate according to a fifth embodiment of the invention.

FIG. 12 shows a seventh embodiment of the invention.

FIG. 14 shows an eighth embodiment of the invention.

DETAILED DESCRIPTION OF THE PREFERRED EMBODIMENTS

Figure 1:
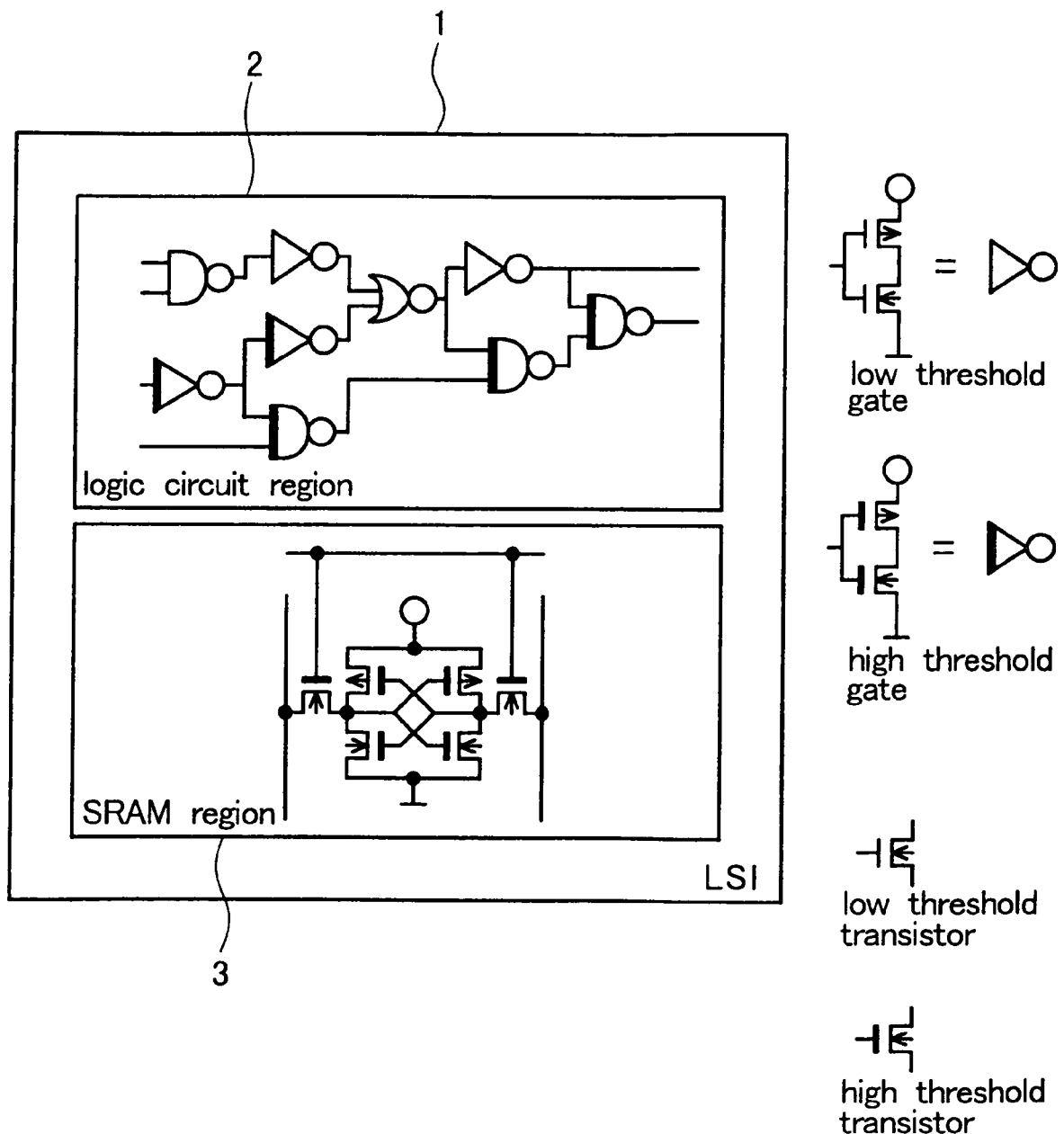
FIG. 1 is a schematic diagram of a semiconductor integrated circuit device according to a first embodiment of the invention.

FIG. 1 is a schematic diagram of a semiconductor integrated circuit device according to a first embodiment. A logic circuit region 2 and an SRAM region 3 are integrated on the same semiconductor integrated circuit device 1. Particularly, as shown in the drawing, transistors as components of gates in the logic circuit region 2 include high threshold transistors and low threshold transistors.

In the logic circuit region 2, it is sufficient to select the threshold of a transistor as a component of a logic gate in accordance with the operating speed required by the gate. An effect that the operating speed of a section using the gate formed by a low threshold transistor increases is produced. By using a gate formed by a high threshold transistor for a circuit section which does not require a high operating speed, a leakage current can be reduced. Specifically, a low threshold transistor is used as a transistor on a critical path in the logic circuit in order to increase the operating speed and a high threshold transistor is used as a transistor which is not on the critical path in order to reduce the leakage current. For example, in a split path, a low threshold transistor is used as a transistor before the split. In a junction path, a low threshold transistor is used as a transistor after the junction. When a current control switch for controlling currents in a source—drain path of a transistor which forms a logic gate exists between an operation potential point and the logic gate every block, a high threshold transistor is used as the transistor constructing the switch and a low threshold transistor is used as the transistor constructing the logic gate to be controlled. The method of properly using the high and low thresholds in such a logic circuit is referred to JP-Application No. Hei9-359277.

Figure 2:
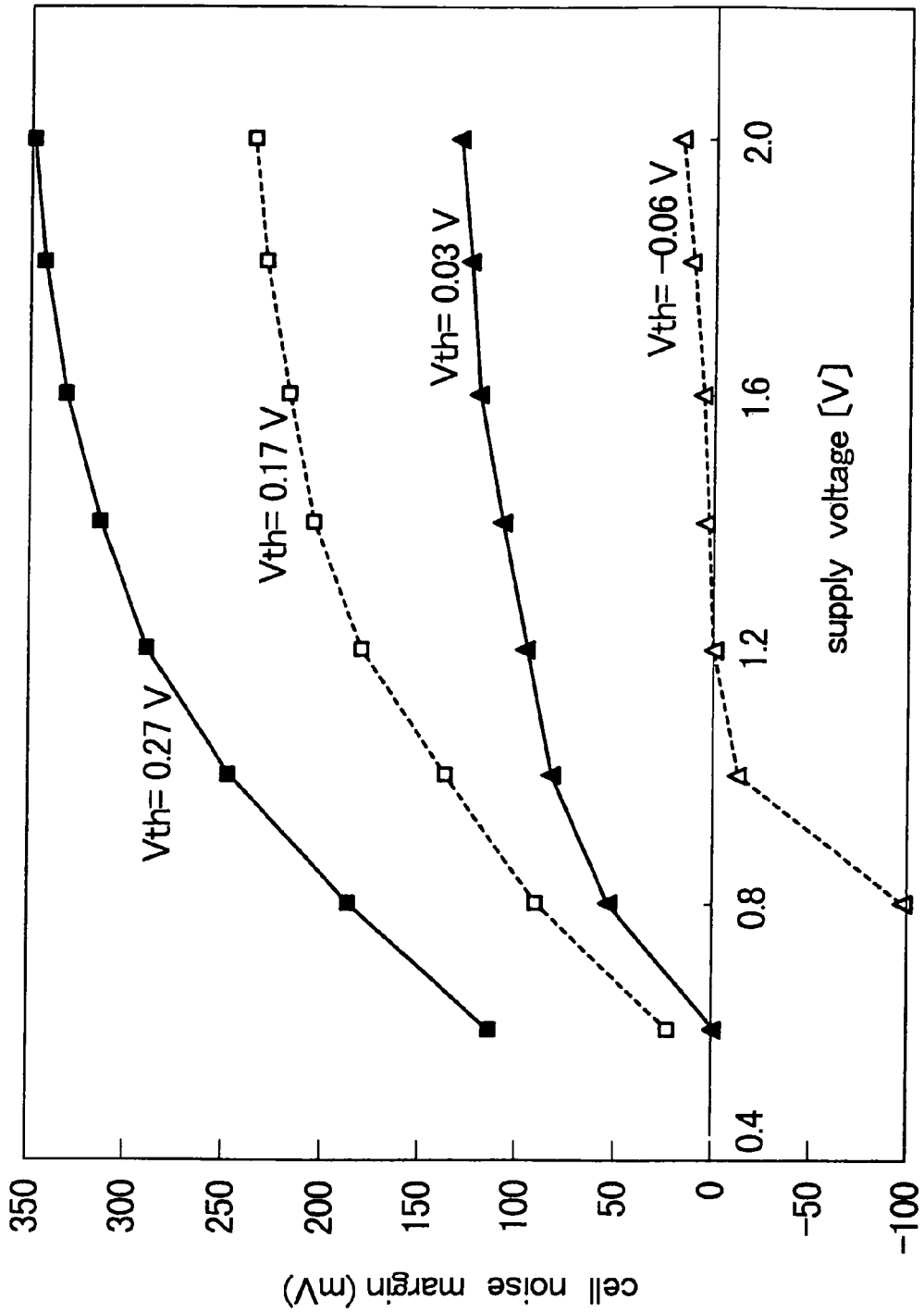
FIG. 2 shows dependence of a noise margin of an SRAM on a supply voltage.

On the contrary, it is desirable to use a high threshold transistor as a transistor constructing an SRAM cell in the SRAM region 3 in order to assure the stability of the SRAM cell. The dependence of a cell noise margin of the SRAM on the supply power is shown in FIG. 2 in order to explain the relation between the threshold of the transistor in the SRAM memory cell and the electric stability of the transistor. As a parameter, a threshold voltage $V_{th}$ of drive transistors (transistors 48 and 49 in FIG. 4) in a memory cell is used. When the cell noise margin drops below 0V, the memory cell does not operate as an SRAM. As the supply voltage decreases, the cell noise margin decreases. In a state where the supply voltage is the same, the lower the threshold voltage $V_{th}$ of the drive transistor is, the lower the cell noise margin is. The thresholds of the transistors are not uniform to one degree or another according to manufacturing processes and a distribution always occurs. When the drive transistor of the SRAM memory cell is designed and manufactured with a low threshold in order to pursue the high operating speed in an integrated circuit device in which the supply voltage is low, the possibility that no noise margin is provided and a memory cell which erroneously operates is generated increases.

Since the memory cell of the SRAM comprised of four NMOS transistors and two PMOS transistors as shown in FIG. 1 can be manufactured in the same manufacturing process as the logic circuit, it is often used as a memory integrated on the same substrate on which the logic circuit is also mounted. When a transistor in a logic circuit whose threshold is decreased to assure the operating speed is manufactured as a transistor in the memory cell of the SRAM, there is a fear that the SRAM does not electrically stably-operate. Further, since it is well known that the threshold of the transistor varies during the manufacturing process, even when the transistor is designed and manufactured with a threshold of a memory cell which can maintain the electric stability on average, a transistor of a low threshold is generated with a predetermined probability due to the variations. Consequently, electric stability in the memory cell is not easily attained.

As the transistors in the SRAM cell, therefore, transistors each having the same construction (the same gate length, gate width, thickness of the gate oxide film, and dose of impurities in a channel) as that of a high threshold transistor in the logic circuit region 2 are used. In this case, naturally, the same transistor as the high threshold NMOS transistor in the logic circuit is used as each of the drive MOS transistor and the transfer MOS transistor each of which is an NMOS transistor in the memory cell of the SRAM. The same transistor as a high threshold PMOS transistor in the logic circuit is used as a load MOS transistor which is a PMOS transistor in the memory cell. Consequently, the transistor in the SRAM cell can be manufactured with the same process as that of the transistor in the logic circuit, and the semiconductor integrated circuit device in which the high-speed logic circuit with a small amount of leakage currents and the electrically stable SRAM cell are integrated on the same substrate can be manufactured in the minimum manufacturing processes.

Simplification of the manufacturing processes will be described hereinlater by using embodiments of the manufacturing process.

Figure 3:
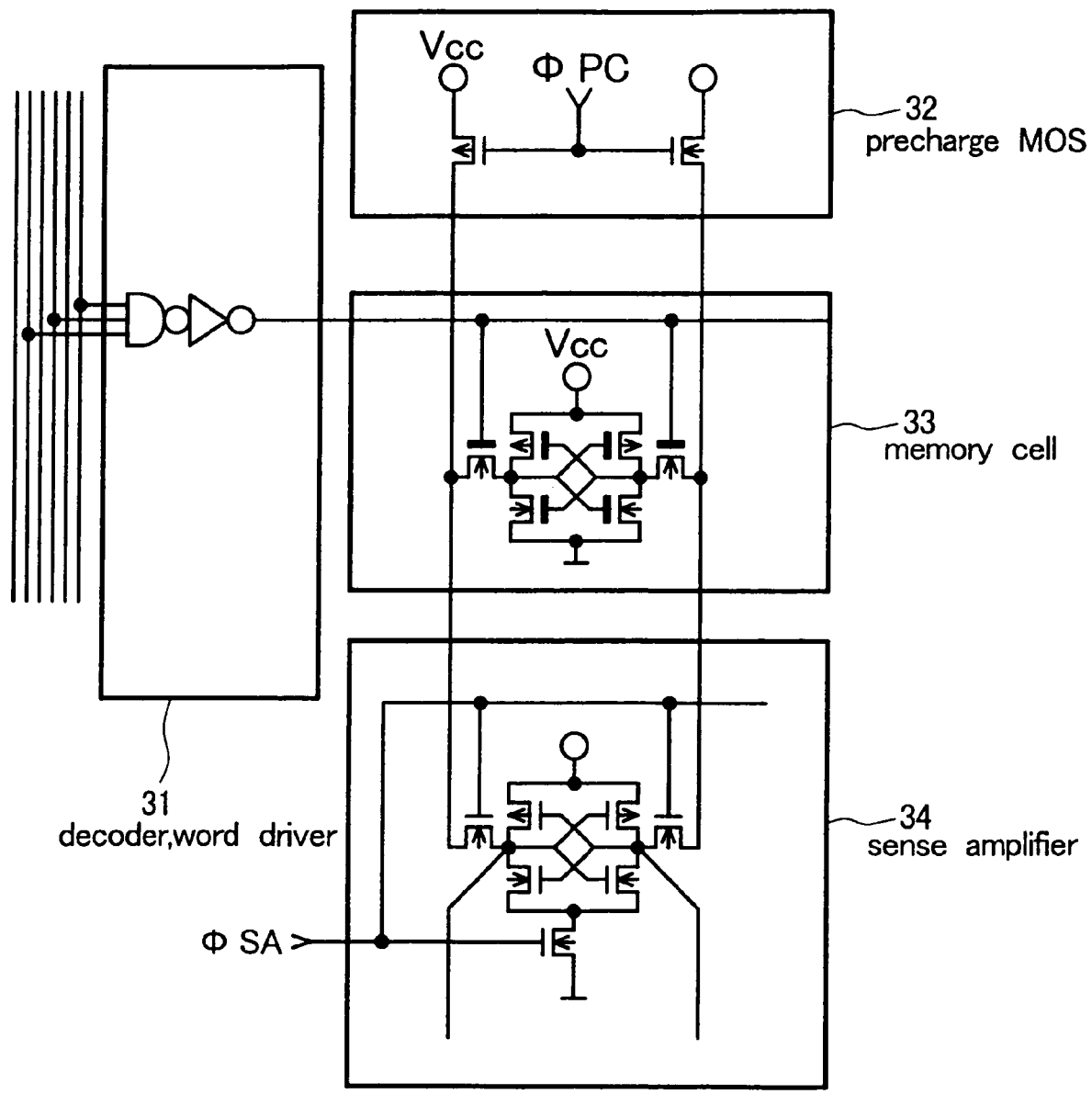
FIG. 3 is a circuit diagram of an SRAM and its peripheral circuits.

FIG. 3 is a circuit diagram of an SRAM and its peripheral circuits (decoder and word driver 31, a precharge MOS device 32, a memory cell 33 and a sense amplifier 34). Although the construction of the transistors in the memory cell has been described above, the relation between the memory cell and the peripheral circuits will now be described. In the SRAM circuit, greater importance is placed on high operating speed. The memory cell 33 is formed by using high threshold transistors as those used in the logic circuit region 2 for electric stability and the other circuit section (decoder and word driver 31, precharge MOS device 32, and sense amplifier 34) is formed by using low threshold transistors as those used in the logic circuit region 2. By the arrangement, the high-speed operation of the SRAM circuit is assured. Particularly, the threshold of the sense amplifier 34 which is requested to have high processing speed has to be set lower than that of the SRAM memory cell.

Figure 4A:
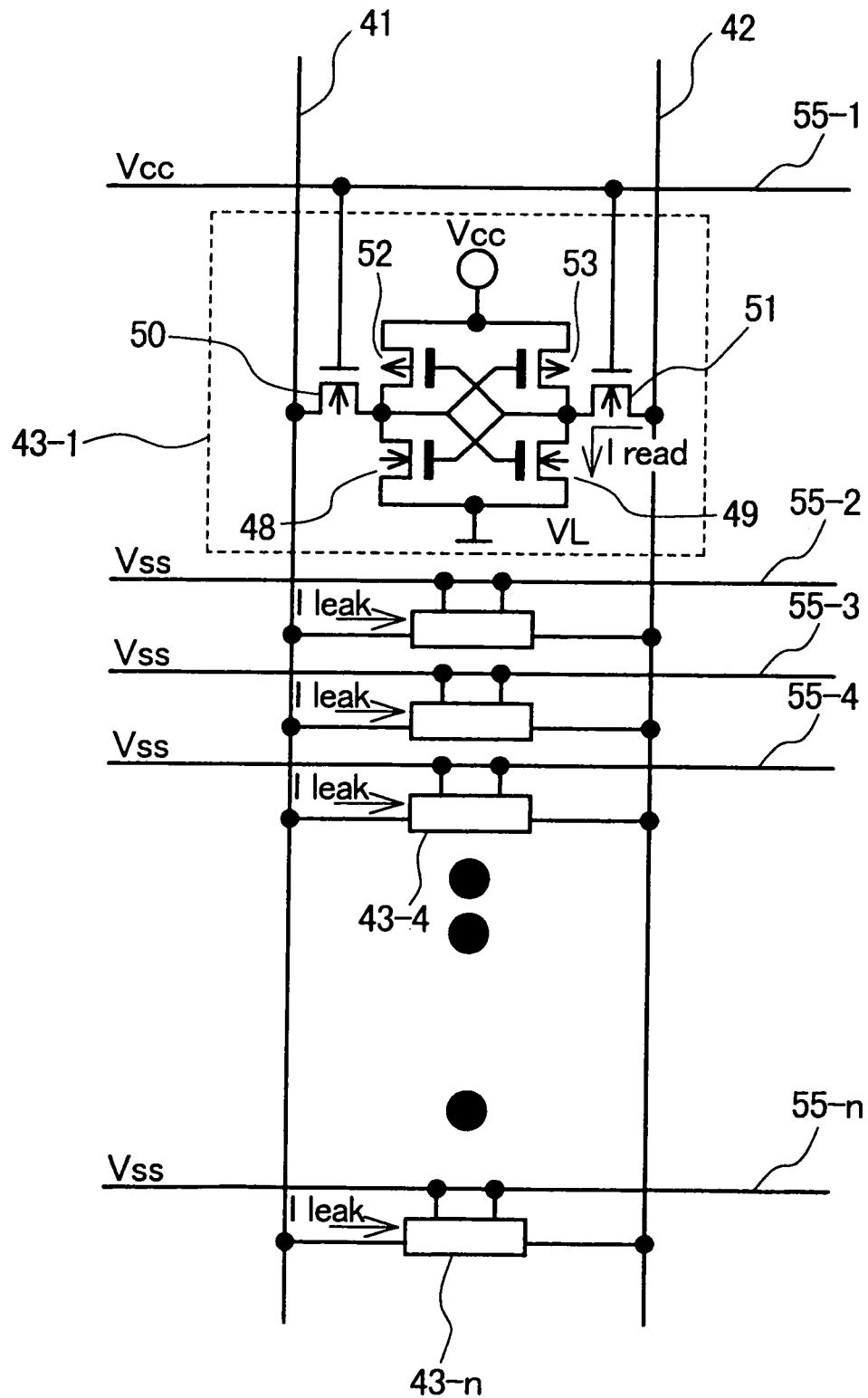
FIGS. 4A to 4C are circuit diagrams showing an array portion of an SRAM according to a second embodiment of the invention.
Figure 4B:
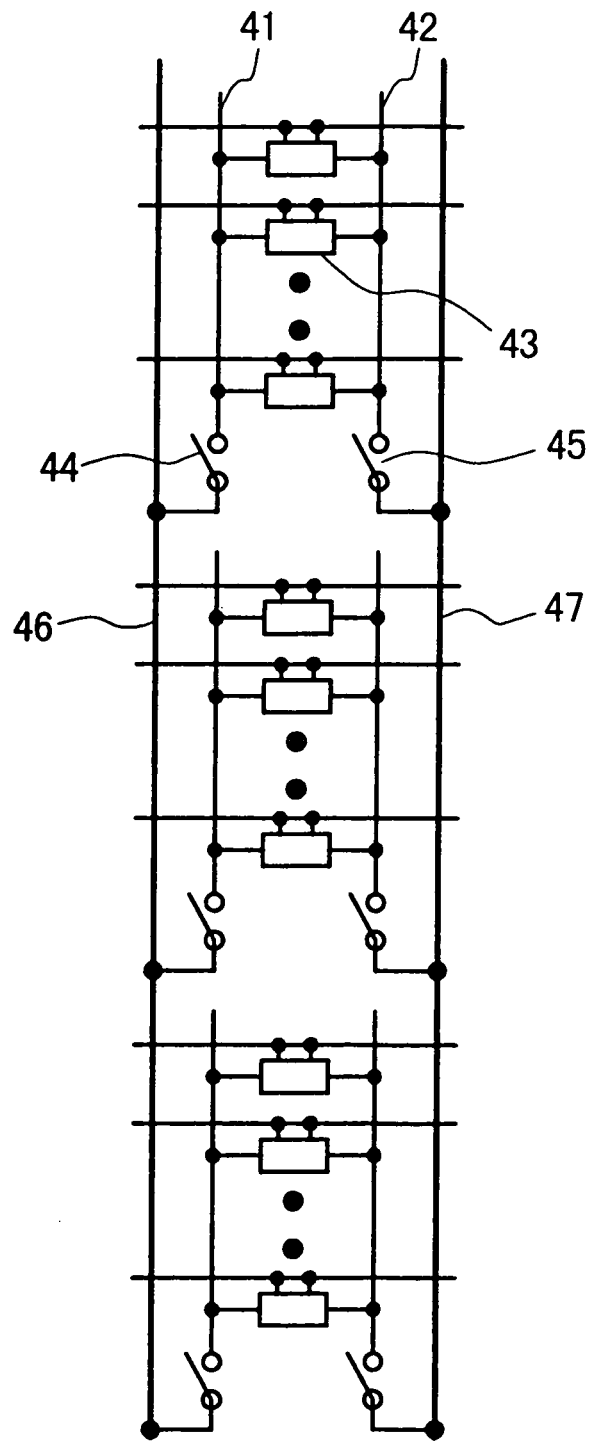
Figure 4C:
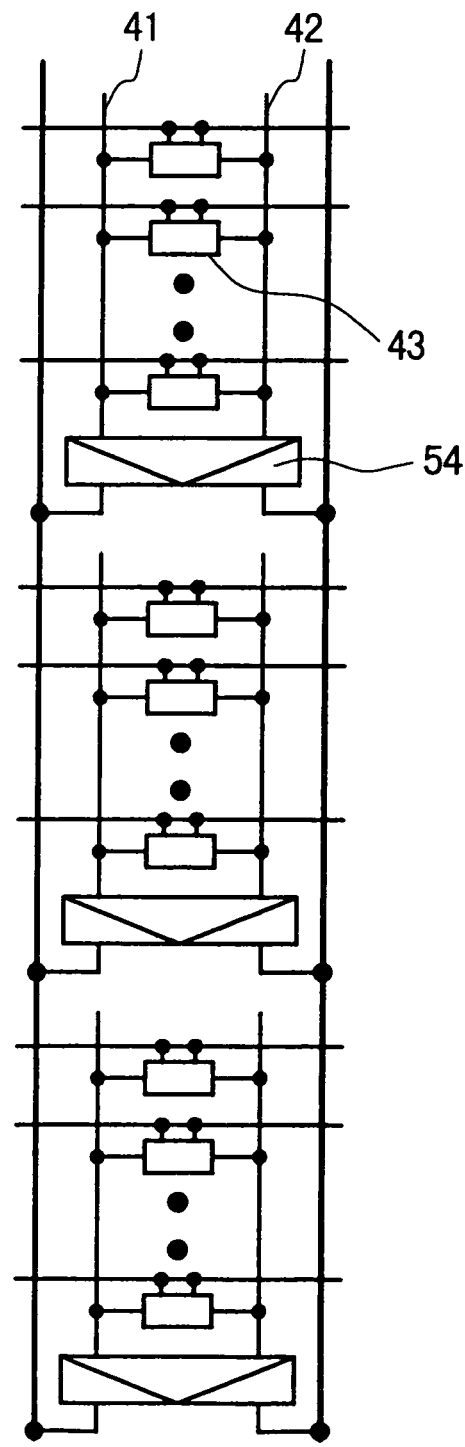

FIGS. 4A to 4C are circuit diagrams of memory cell arrays of an SRAM. In FIG. 4A, a region surrounded by broken lines forms a single memory cell. As shown in FIG. 4A, one memory cell 43 comprises drive NMOS transistors 48 and 49, load MOS transistors 52 and 53 and transfer MOS transistors 50 and 51. A word line 55 is connected to the gate of each of the transfer MOS transistors 50 and 51. A source-drain path of the transfer MOS transistor 50 is connected between the drain of the drive MOS transistor 48 and a bit line 41. A source-drain path of the transfer MOS transistor 51 is connected between the drain of the drive MOS transistor 49 and a bit line 42.

Although it is shown in FIG. 2 that the drive MOS transistor in the SRAM memory cell influences the cell noise margin, the threshold of the transfer MOS transistor does not influence the cell noise margin. The magnitude of a current Iread and speed at the time of reading the memory cell depend on the current driving capability of the transfer MOS transistor more than the drive MOS transistor. Consequently, the SRAM memory cell has transistors of different constructions. By setting only the threshold of the transfer MOS transistor to be low, the memory cell of the SRAM having a large current value at the time of reading can be realized.

Specifically, in order to simultaneously mount the logic circuit and the SRAM memory, as the drive MOS transistor in the memory cell, the same transistor as the high threshold NMOS transistor in the logic circuit is used. As the transfer MOS transistor in the memory cell, the same transistor as the low threshold NMOS transistor in the logic circuit is used. In such a manner, the SRAM memory cell which is electrically stable, has a large amount of read currents Iread, and operates at high speed can be manufactured without making the manufacturing process complicated. Although not as much as the drive MOS transistor, the load MOS transistor also influences the cell noise margin. It is therefore sufficient to use the same high threshold PMOS transistor in the logic circuit as the load MOS transistor in order to reduce the leakage in the memory cell.

As described above, by decreasing the threshold of the transfer MOS transistor, the operating speed of the memory cell is increased. It is, however, already known that, when the number of memory cells connected to the bit lines 41 and 42 increases, another problem described hereinbelow occurs.

FIG. 4A shows an example in which a memory cell connected to a word line 55-1 is accessed and memory cells connected to other word lines 55-2 to 55-$n$ (n: the number of memory cells connected to bit lines) are not accessed. In this case, the read current Iread is passed to a memory cell 43-1 which is accessed via the word line and is at the "High" level. A leakage current Ileak accompanying a subthreshold current flows in other memory cells 43-2 to 43-$n$ which are connected to the bit lines 41 and 42 but are not accessed. The total of the leakage current becomes (n×Ileak) at the maximum. When this current becomes larger than the read current Iread, that is, when the leakage current becomes larger than the signal current, stored data cannot be read out. This problem becomes more conspicuous as the number (n) of memory cells connected to bit lines increases.

When the number of memory cells connected to the bit lines increases, the bit lines are arranged hierarchically by using global bit lines as shown in FIGS. 4B and 4C. In FIG. 4B, global bit lines 46 and 47 are connected to the bit lines 41 and 42 via switch MOS transistors 44 and 45, respectively, and the memory cells are divided in banks. In this case, the switch MOS transistors 44 and 45 may be realized by connecting the source and drain paths of PMOS and NMOS transistors in parallel as disclosed in JP-A No. H10-106269. At the time of a reading operation, the PMOS transistor is made conductive. At the time of a writing operation, the NMOS transistor is made conductive. As the switch PMOS and NMOS transistors, the same high threshold transistors as the PMOS transistors 52 and 53 and the drive NMOS transistors 48 and 49 in the memory cell can be used. That is, the same transistors as the high threshold transistors in the logic circuit can be used.

In FIG. 4C, in place of the switch MOS transistors 44 and 45, a sense amplifier 54 is used. In this case, the sense amplifier 54 can realize a high speed operation by being constructed by the same transistors as the low threshold transistors in the logic circuit region 2.

By the hierarchical arrangement, the number of memory cells connected to the bit lines can be decreased. Even in the case of using an SRAM of a large capacity, the problem of the leakage current of the memory cell can be avoided and an electrically stable and high-speed SRAM can be realized.

Although it has been described that the circuit is constructed by using transistors of different thresholds, a method of realizing it has not been described. A method of realizing it and, further, a process of realizing formation of transistors having a plurality of thresholds in a single integrated circuit device will be described.

FIG. 5 shows the relation between the threshold $V_{th}$ of the transistor and thickness $T_{ox}$ of a gate oxide film. Even when the number of channel implantation is not increased, the number of thresholds of transistors can be increased. The threshold voltage $V_{th}$ of the NMOS transistor is given by the following equation.

$$V_{th} = V_{FB} + 2\Phi FP + Q_B/C_o \quad (1)$$

where, $V_{FB}$ denotes a flat band voltage, $\Phi_{FP}$ denotes a difference in Fermi level between an intrinsic semiconductor and a semiconductor containing impurities and the like, $Q_B$ denotes the quantity of charges per unit area of a depletion region below a channel, and $C_o$ indicates a capacity per unit area of a gate oxide film. $C_o$ is given by the following equation.

$$C_o = \epsilon/T_{ox} \quad (2)$$

where, $\epsilon$ denotes a dielectric constant of the gate insulating film and $T_{ox}$ denotes the thickness of the gate oxide film. As shown in FIG. 5, therefore, as the thickness $T_{ox}$ of the gate oxide film increases, the threshold $V_{th}$ increases.

In FIG. 5, the dose of impurities implanted in a channel in the case of a first threshold voltage $V_{th}$ 57-1 and that in the case of a second threshold voltage $V_{th}$ 57-2 are different from each other. Even if the gate oxide thickness is the same, the first threshold voltage $V_{th}$ 57-1 in a larger dose is higher than the second threshold voltage $V_{th}$ 57-2 in a smaller dose. When the characteristic is used, by increasing the does of impurities into the channel of a transistor (a) having a predetermined gate oxide film thickness, a MOS transistor (b) having the same gate oxide film thickness and a larger threshold can be obtained. For example, by using the transistors (a) and (b) obtained by adjusting the dose, the logic circuit region 2 and the SRAM region 3 are constructed. Consequently, an integrated circuit device on which the logic circuit region 2 has a high operating speed with a low leakage current and the SRAM region 3 which is electrically stable and has a high operating speed can be manufactured with minimum manufacturing processes.

Further, as understood from the relation between a transistor (c) to the transistor (a) in FIG. 5 or a transistor (d) to the transistor (b), even when the dose of the impurities to the channel is the same, by making the gate oxide film thicker, the threshold voltage can be increased. By changing the dose of impurities into the channel in the MOS transistor and/or the thickness of the gate oxide film, a desired threshold voltage of an MOS transistor can be obtained. By using the characteristic, circuits of DRAM memory cell and interface can be manufactured by the minimum processes. This will be described in the following embodiment.

Figure 6:
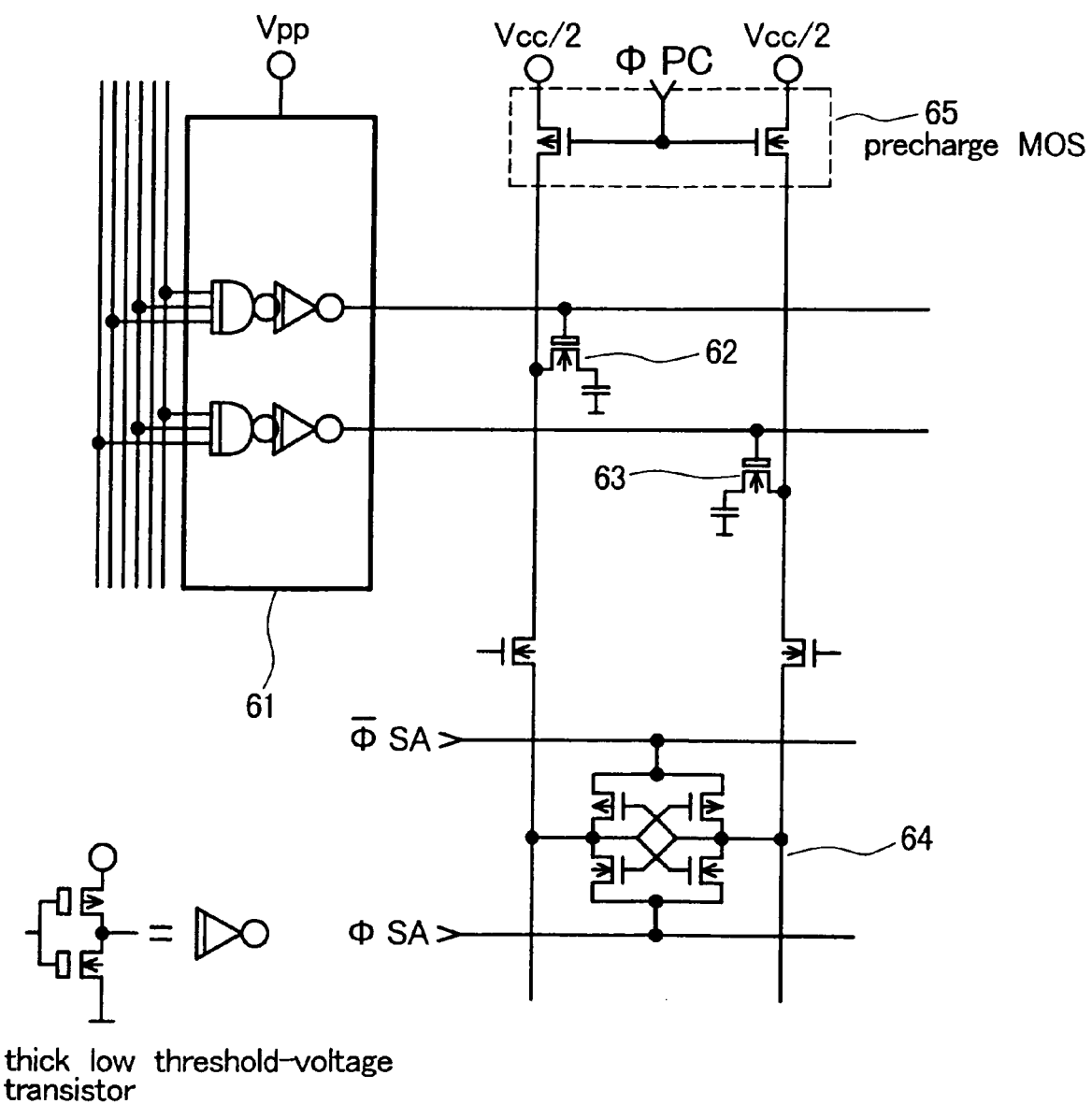
FIG. 6 shows an array of DRAM cells according to a third embodiment of the invention.

FIG. 6 shows a second embodiment of the invention which is suitable for a memory array of DRAM cells. DRAM memory cells 62 and 63 are connected to word lines extended from a word driver 61. Charges accumulated in the capacitor in each of the DRAM memory cells are read out by a sense amplifier 64 via the bit line.

Each of the DRAM cells comprises an NMOS transistor whose gate is connected to the word line and one capacitor. When data is "0", potential "0" is written in the capacitor in the DRAM cell. When data is "1", a supply voltage $V_{cc}$ is written in the capacitor. Data is written by turning on the gate of the NMOS transistor by applying a voltage via the word line. When data is written by applying the supply voltage $V_{cc}$ to the gate electrode of the NMOS transistor, only a voltage of $(V_{cc}-V_{th})$ is written in the capacitor. By setting the voltage applied through the word line to $(V_{cc}+V_{th})$, the voltage $V_{cc}$ can be applied to the capacitor. Since the voltage of the word line is increased to $(V_{cc}+V_{th})$, the gate oxide film of the transistor in the DRAM memory cell has to be made thicker in order to assure that the gate withstands the voltage. The threshold voltage of the transistor in the DRAM memory cell has to be increased so that charges accumulated in the capacitor are not discharged by a leakage current of the transistor.

Consequently, the property shown in FIG. 5 such that as the thickness of the gate oxide film of the MOS transistor increases, the threshold voltage increases is used. In the logic circuit regions integrated on the same substrate, as already described in the explanation of the logic circuit region in FIG. 1, as a transistor which is requested to operate at high speed, a low threshold transistor (transistor (a) in FIG. 5) is used. As a transistor which is not requested to operate at high speed, a high threshold transistor (transistor (b) in FIG. 5) is used to reduce the leakage current. Both of the high and low threshold transistors in the logic circuit region are realized by transistors having the same gate oxide film thickness. In order to realize two threshold values in the logic circuit, it is the easiest to change the dose of impurities implanted in a channel since the change in threshold when the length and width of a gate in the transistor are changed within an adjustable range by a present process is smaller than a change when the impurity dose is changed. The threshold can be varied also by changing the length and width of the gate in the transistor. Those methods are easier than changing the thickness of the oxide film. When the thickness of the oxide film is changed, a step between oxide films of different thickness becomes a problem. It is not difficult to control a step in an area of a memory cell or in a larger area. It is, however, difficult to change the thickness of the oxide film at the transistor level since the step causes a breakage of a wire or the like.

Although it is not easy to change the thickness of the oxide film by a process, the property as described above is used. As an NMOS transistor in the memory cell of the DRAM, a transistor whose oxide film is thicker than that of a transistor in the logic circuit by implanting the same dose of impurities per unit area as that of the high threshold transistor in the logic circuit is used. Even when the same dose of impurities is used as that of a low threshold transistor in the logic circuit, a threshold value higher than the low threshold value in the logic circuit is realized because of a difference in the oxide film thickness. Since a change in the threshold due to the difference in the oxide film thickness is small, by using the same dose of impurities as that of the high threshold transistor, a high threshold which can reduce the leakage current can be obtained. The dose of impurities implanted in the logic circuit region (d) in FIG. 5 and that in the memory region can be equalized without increasing the number of masks, so that it is advantageous from the viewpoint of manufacture of the integrated circuit device. When it is described that the doses of impurities are equal to each other, obviously, variations which can naturally occur in manufacture are included.

A transistor of a construction according to necessity can be used in circuits except for the memory cell in the DRAM. Since the word driver 61 generates a high word line voltage, the gate oxide film of the transistor is made thick. On the other hand, in order to increase the operating speed, a low threshold is desired. Under such conditions, as the transistor in the word driver 61, a transistor (transistor (c) in FIG. 5) having a thick oxide film formed by implanting the same dose of impurities to a channel as that of a low threshold transistor in the logic circuit is used. Since a high voltage is not applied to a precharge MOS transistor 65 and the sense amplifier 64, it is sufficient to use transistors each having the same gate oxide film thickness as that of transistor in the logic circuit. In this case, when priority is placed on the operating speed, a low threshold transistor (transistor (a) in FIG. 5) is used. When priority is placed on reduction in leakage currents, a high threshold transistor (transistor (b) in FIG. 5) is used.

Figure 7:
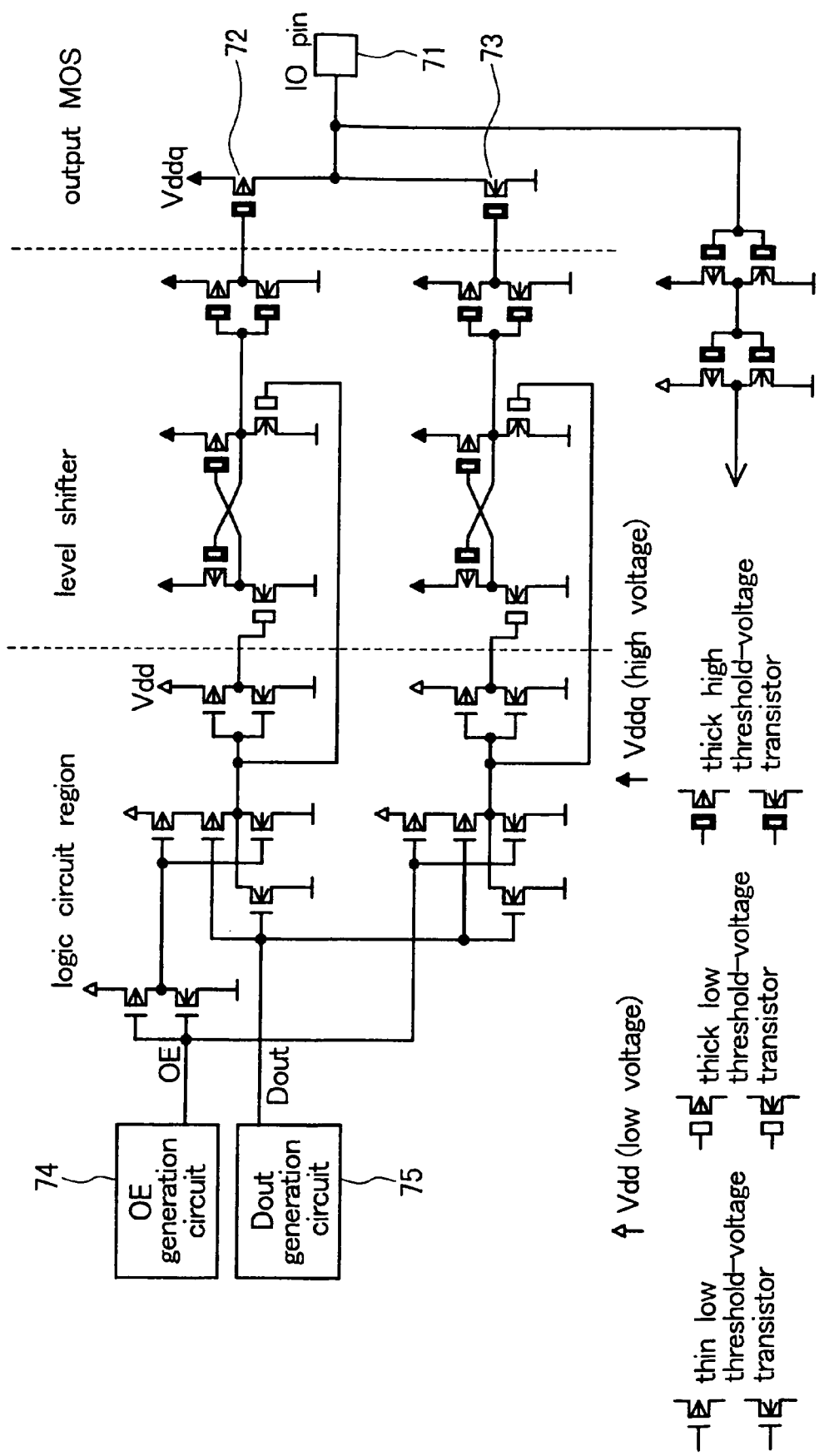
FIG. 7 shows an IO (data input output buffer) according to a fourth embodiment of the invention.

FIG. 7 shows a third embodiment of the invention and is suitable for a data input/output buffer circuit (IO). FIG. 7 shows a region sandwiching a logic circuit region 81 and an IO region 84 in FIG. 8. Shown in FIG. 7 are a data IO pin 71, output MOS transistors 72 and 73, an OE (Output Enable) generation circuit 74 and a Dout (Data out) generation circuit 75. Data is outputted in response to an OE signal generated from the OE generation circuit 74. When the OE signal is at the logic level of 'high', a data signal generated from the data generation circuit 75 is outputted to the IO pin 71 via a level shifter and an output MOS transistor.

Generally, a supply voltage larger than the supply voltage ($V_{dd}$) to the logic circuit region is applied to a data IO buffer circuit for outputting data from the logic circuit region to the data IO pin 71 for the following reason. The supply voltage in the logic circuit region is decreased as the thickness of the oxide film is reduced in accordance with the higher performance of a device. On the contrary, the supply voltage applied to the data IO buffer circuit is determined according to the specification. For example, in the generation of the process which can realize the gate length of 0.25 um, the supply voltage to the logic circuit region ranges from 1.8V to 2.5V. On the contrary, the supply voltage is often 3.3V with which the data IO buffer circuit can output a TTL level.

In the embodiment, the OE generation circuit and the Dout generation circuit exist in the logic circuit region. In the region, a thin gate oxide film is used and it is sufficient that the circuits are constructed by properly using the low threshold transistors and the high threshold transistors as described above. On the other hand, the level shifter is a circuit for converting a signal of a low voltage into a signal of a high voltage. Since a high voltage is applied to transistors in the circuit, in order to assure that the gate withstands a high voltage, a thick film transistor is employed. As a high voltage is applied also to the output MOS transistors, thick film transistors are used. Since a high voltage is used in both the level shifter and the output MOS transistors, the thick film transistors of a high threshold is used. The gate of a transistor in the level shifter receives a low voltage signal from the transistor in the logic circuit region, so that a low threshold transistor has to be used exceptionally. Since the logic circuit region operates with a low voltage, an output of the transistor in the logic circuit region is smaller than the voltage of the source-drain path of the transistor in the level shifter which receives the output. The same dose of impurities as that in the case of a thin-film low-threshold transistor can be implanted to the channel of the transistor.

That is, in the embodiment, each of a thin-film low-threshold transistor, a thick-film low-threshold transistor, a thin-film high-threshold transistor and a thick-film high-threshold transistor is formed by implanting the same dose of impurities into a channel. Consequently, a high-speed output buffer which is very reliable even when a high voltage is applied can be formed without increasing the number of manufacturing processes.

FIG. 8 shows a fifth embodiment of the invention, in which a logic circuit region 81, an SRAM region 82, a DRAM region 83 and an IO circuit region 84 are formed on the same substrate. The table in the lower part shows the kinds of transistors used in the respective regions.

As shown in the table, in the logic circuit region 81 and the SRAM region 82, since high-performance transistors each having a short gate and a thin gate oxide film are used, a relative low supply voltage such as 1.5V is set. The low threshold transistors in the logic circuit with about 10% of transistors in order to increase the operating speed and high threshold transistors and about 90% (the rest) of transistors in order to reduce leakage currents is referred to JP-Application No. Hei9-359277. In the SRAM memory cell, a high threshold transistor is used as the drive MOS transistor for electric stability and a low threshold transistor is used as the transfer MOS transistor in order to increase the operating speed. On the other hand, in the memory cell region of the DRAM, since a high voltage is applied, the oxide film is made thick and the threshold voltage is set to be high. Since a relatively high voltage is applied to the IO circuit in accordance with the specification, the gate oxide film is made thick and a high threshold voltage is used.

In order to manufacture the four circuit blocks without complicating the manufacturing processes, the threshold of the high threshold transistor in the logic circuit and the threshold of the transistor in the SRAM cell are made coincide with each other. The oxide film of the transistor in the DRAM memory cell and that of the transistor in the IO circuit are made thick. The channel can be formed by using impurities of the same dose as that of high and low threshold transistors used as thin film transistors.

Figure 9:
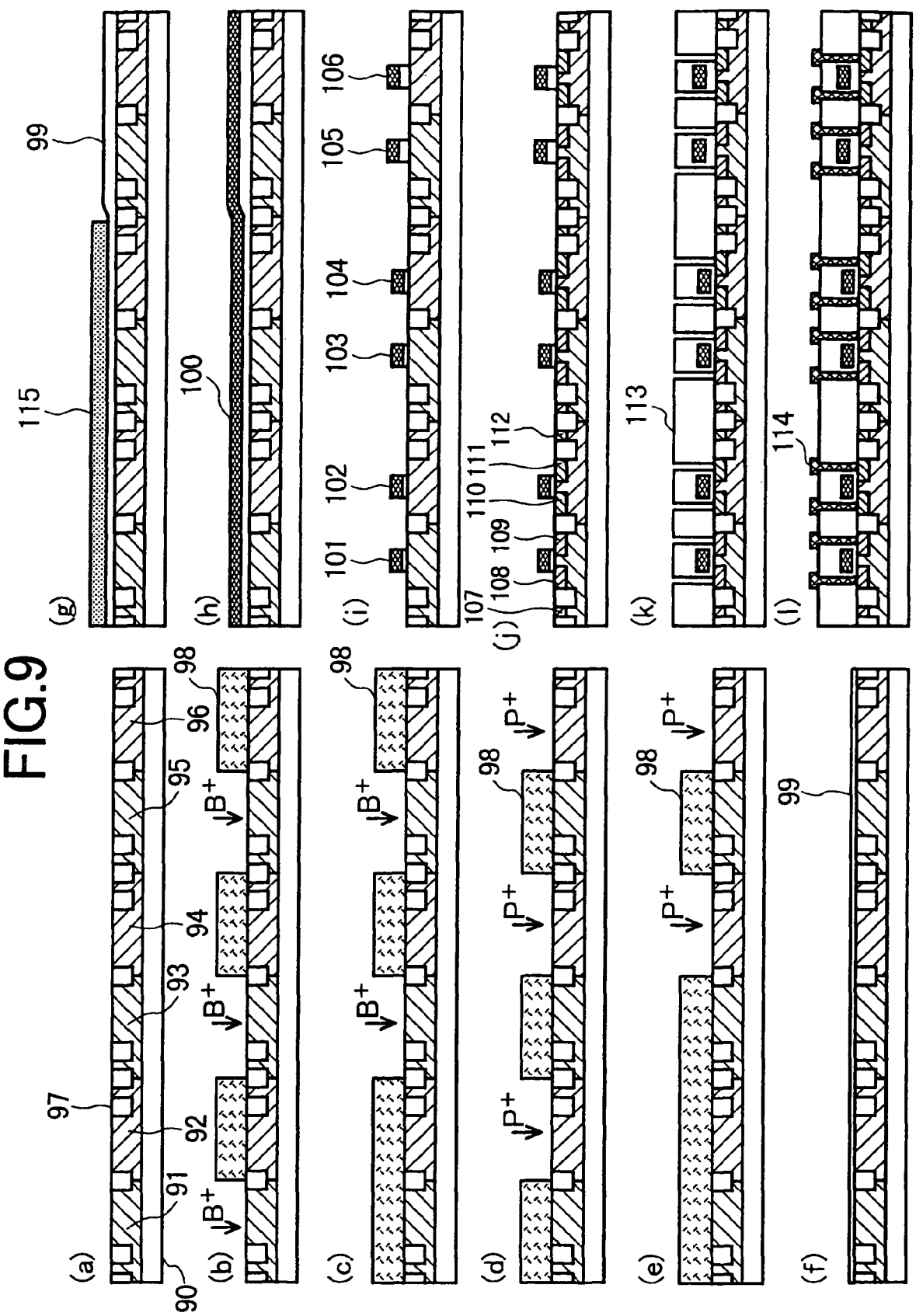
FIG. 9 shows manufacturing process steps (a) to (l) which realize the invention.

FIG. 9 shows manufacturing process steps (a) to (l) which realize the invention. In FIG. 9, the step (a) shows a semiconductor substrate 90; P wells 91, 93 and 95; N wells 92, 94 and 96; and dioxide regions 97 for isolation. The wells 91 and 92 will make NMOS and PMOS transistors of a low threshold voltage, the wells 93 and 94 will make NMOS and PMOS transistors of a high threshold voltage, and the wells 95 and 96 will make NMOS and PMOS transistors of a high threshold voltage, each having a thick oxide film.

As shown in the diagram, isolation regions and wells are formed first in an integrated circuit. In step (b), by using a resist 98 as a mask, acceptor impurities such as B, Al, Ga, or In are implanted into the P well regions 91, 93 and 95. Further, in step (c), ions are implanted only into the P well regions 93 and 95. Finally, the NMOS transistors in the P well regions 93 and 95 have a high threshold value.

In step (d), the resist 98 is used as a mask and donor impurities such as P, Sb or As are implanted into the N well regions 92, 94 and 96. Further, in step (e), ions are implanted only into the N well regions 94 and 96. Consequently, finally, the PMOS transistors in the N well regions 94 and 96 have a high threshold value in absolute value.

In step (f), the first gate oxide oxidation is performed, thereby forming a gate oxide film 99. Further, an oxi-nitride film 115 is formed. When gate oxidation is performed by using the oxi-nitride film 115 as a mask, only the right portion of the gate oxide film 99 becomes thick. That is, the gate oxide film of the portion of the P well 95 and the N well 96 becomes thick and the gate oxide film of the other portion remains thin. After that, a polysilicon film 100 which becomes a gate electrode is formed in step (h). By processing the polysilicon film 100 in step (i), gate electrodes 101, 102, 103, 104, 105 and 106 are formed. The well potential is fixed and n+ type diffusion layers 108, 109 and 112 and p+ type diffusion layers 110, 111 and 107 which will become drain and source electrodes in transistors are formed in step (j). Further, an insulation interlayer 113 is formed in step (k) and electrodes 114 are formed in step (l). In such a manner, transistors are completed.

According to the processes shown in the embodiment, the thin-film low-threshold NMOS transistor 101 is formed in the P well 91. The thin-film low-threshold PMOS transistor 102 is formed in the N well 92. The thin-film high-threshold NMOS transistor 103 is formed in the P well 93. The thin-film high-threshold PMOS transistor 104 is formed in the P well 94. The thick-film high-threshold NMOS transistor 105 is formed in the P well 95. The thick-film high-threshold PMOS transistor 106 is formed in the P well 96. As described above, the semiconductor integrated circuit device can be formed by using the six kinds of transistors shown here. That is, the logic circuit can be formed by using the transistors 101, 102, 103 and 104. The drive MOS transistor in the SRAM is realized by the transistor 103. The transfer MOS transistor in the SRAM is realized by the transistor 101 or, as necessary, the transistor 103. The transfer MOS transistor in the DRAM cell is realized by the transistor 105. The output MOS transistors are realized by using the transistors 105 and 106. Although not shown here, the thick-film low-threshold transistors can be manufactured by the same processes. Obviously, in accordance with necessity of a circuit, thick-film low-threshold transistors can be also used.

In the embodiment, the oxide film 99 has two thickness values and three thresholds each for the NMOS transistors and the PMOS transistors. In the case of realizing both high operating speed and low leakage current, it is inevitable to use the two thresholds in the logic circuit. For an LSI to which a low voltage and a high voltage are simultaneously applied, it is also inevitable to use the two thickness values. In the invention, transistors optimum to the operations of the SRAM and DRAM memory cells can be provided without increasing the number of manufacturing processes. Consequently, it produces an effect such that the semiconductor integrated circuit device having the memory array which operates with a low voltage can be provided without increasing the number of processes.

Figure 10:
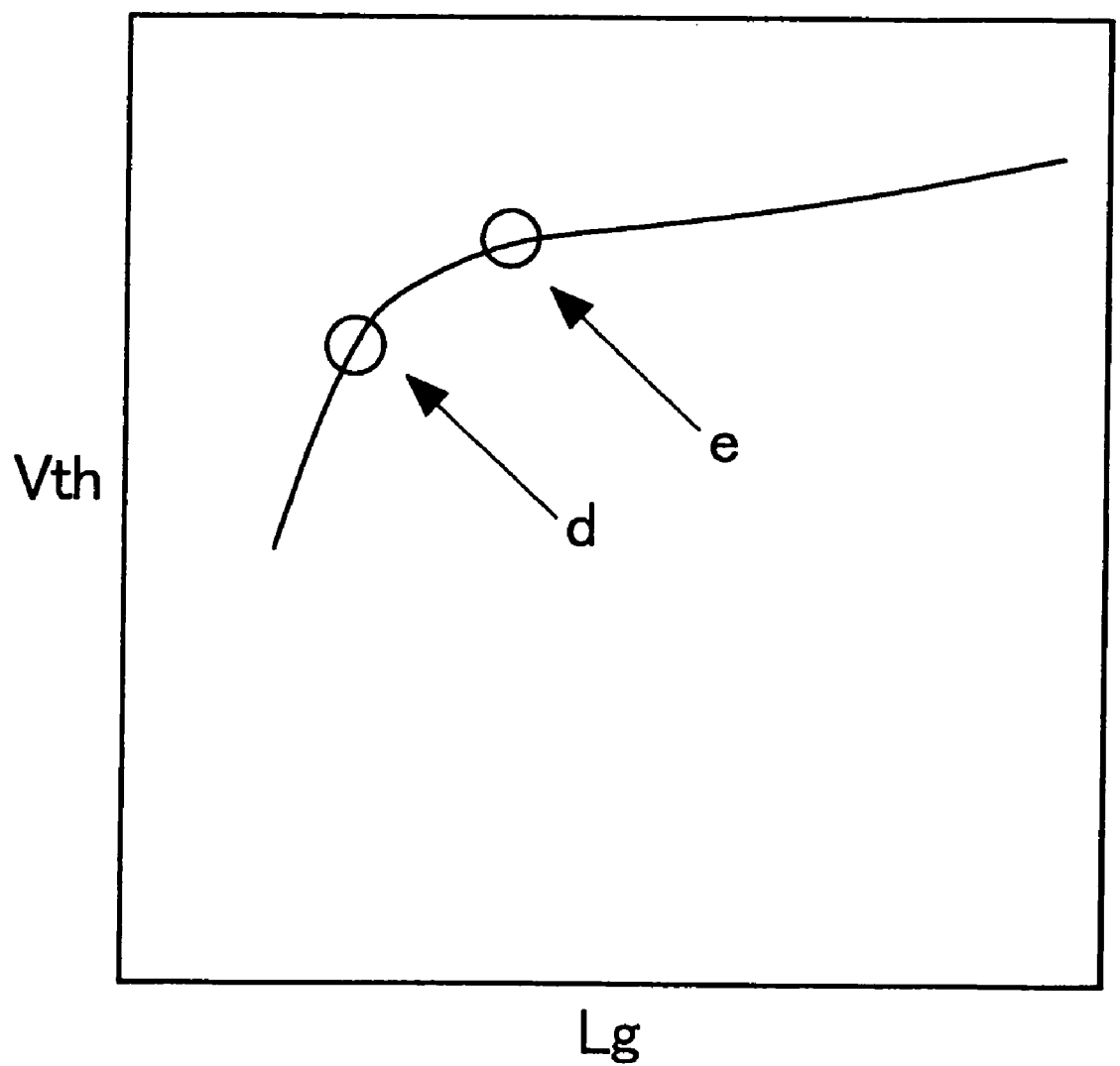
FIG. 10 shows dependence of the threshold voltage on the gate length.
Figure 11:
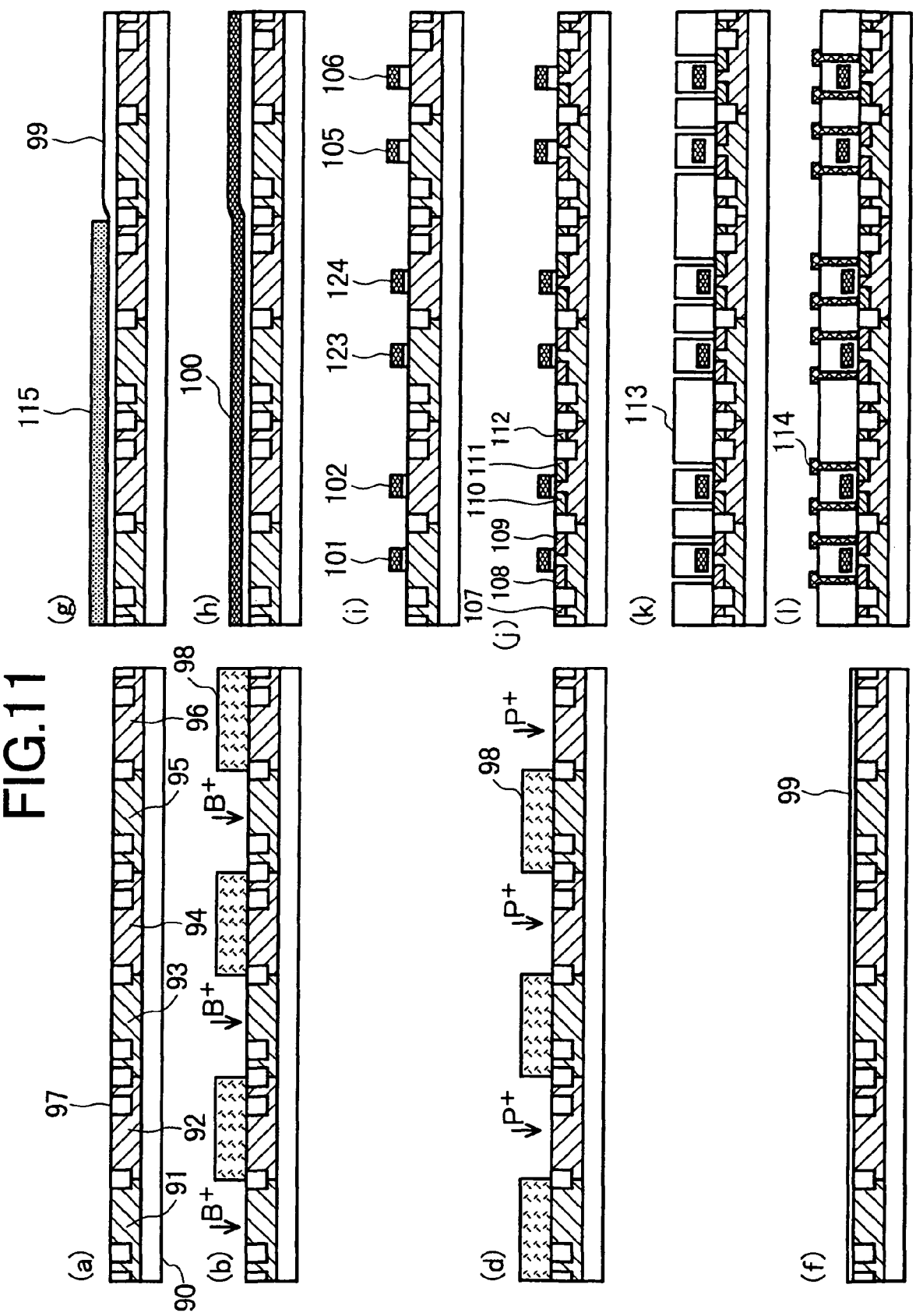
FIG. 11 shows other manufacturing process steps (a), (b) (d), (f) and (g) to (l) according to a sixth embodiment of the invention.

FIG. 10 is a diagram showing the dependence of the threshold voltage $V_{th}$ on the gate length Lg. Generally, in an MOS device, a phenomenon such that when the gate length is shortened, the threshold voltage sharply drops occurs. When the region is used, by changing the gate length, two thresholds can be obtained as shown by (d) and (e) even if the dose of impurities implanted in the channels is the same. The process of ion implantation shown at the step (c) or (e) in FIG. 9 can be omitted by adjusting the gate length by changing the mask face. That is, as shown at the step (i) in FIG. 11, gate electrodes 123 and 124 are made longer than the gate electrodes 101 and 102, thereby enabling the thresholds of the transistors 123 and 124 to be made higher than those of the transistors 101 and 102. As described above, however, since the threshold voltage largely changes only in a limited region, the degree of freedom in control is low as compared with the implantation. In the sixth embodiment, the oxide film 99 has two thickness values and three threshold values each for NMOS transistors and PMOS transistors. In order to obtain the high speed and low leakage currents, it is inevitable for the logic circuit to have two thresholds. The invention can provide transistors optimum for the operation of the SRAM memory cells without increasing a process from the necessary manufacturing processes. Consequently, it produces an effect such that the semiconductor integrated circuit device having the memory array which operates with a low voltage can be provided without increasing the number of processes.

FIG. 12 shows the conditions to realize optimum thresholds when the logic circuit, SRAM, DRAM and IO circuit are mounted on the same semiconductor substrate in the seventh embodiment of the invention. Obviously, it is sufficient to use the process steps shown in FIG. 11. For high processing speed, as about 10% of transistors in the logic circuit, transistors each having a long channel is used. On the other hand, in order to reduce leakage currents, as about 90% of transistors, transistors each having a long channel and a high threshold are used. In the SRAM memory, as the drive MOS transistor, a high threshold transistor having a long channel is used for electric stability. As the transfer MOS transistor, a transistor having a short channel is used for high operating speed. In the DRAM memory cell region, since a large voltage is applied, the thick oxide film, the long gate, and the high threshold are used. Since a relatively high voltage is usually applied to the IO circuit in accordance with the specification, the gate oxide film is made thick and a high threshold transistor having a long gate is used.

In such a manner, without increasing the number of manufacturing steps of channel implantation, the transistors having optimum thresholds for the respective circuits are provided and the semiconductor integrated circuit device of high-speed and low leakage currents can be provided.

Figure 13A:
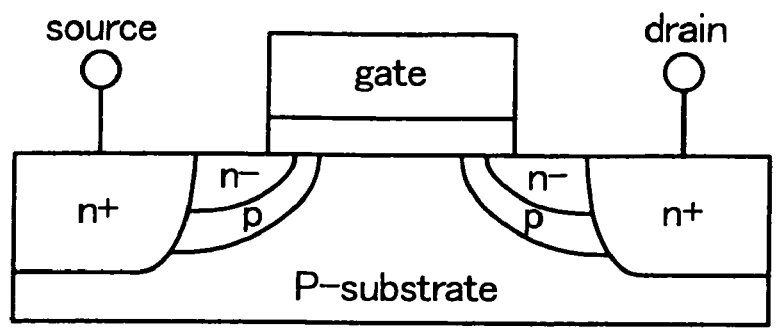
FIGS. 13A and 13B are diagrams showing the structure of a transistor which is often used in recent years and characteristics of the threshold voltage of the transistor.
Figure 13B:
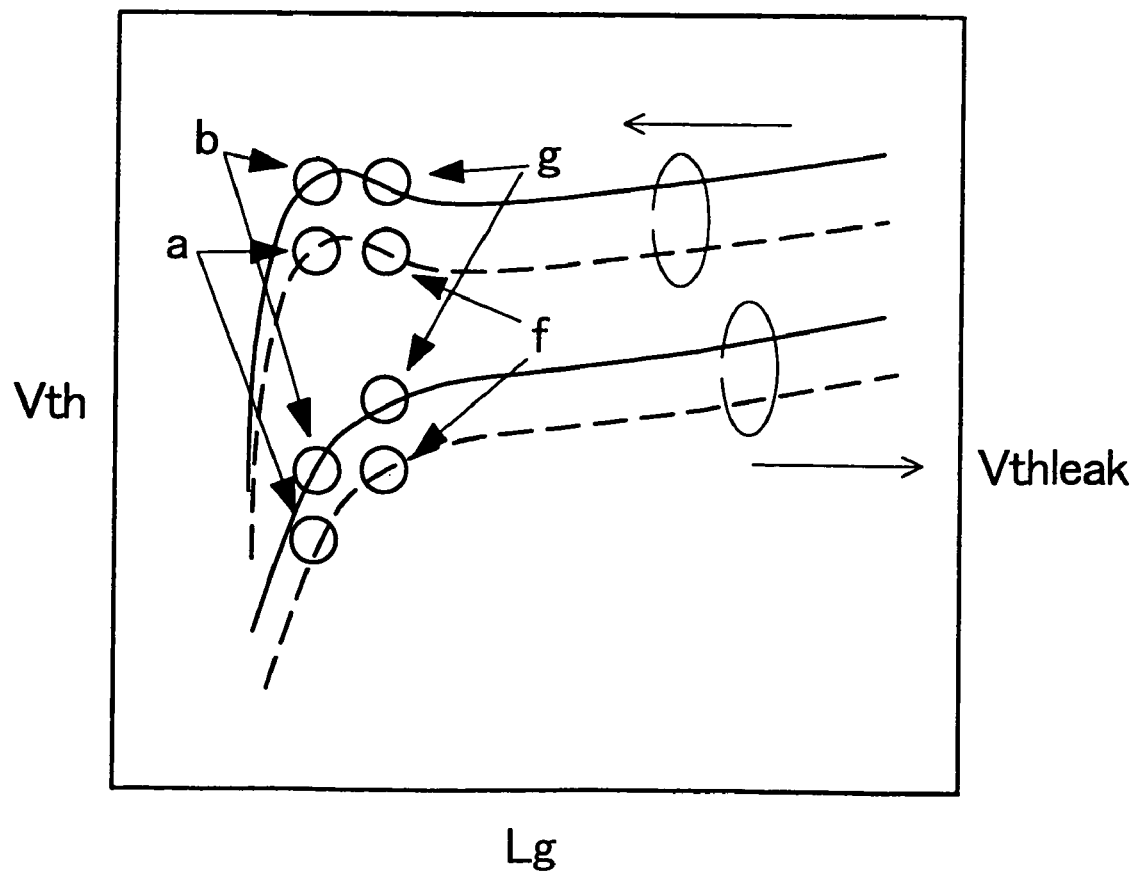

FIG. 13A shows the structure of a transistor which is often used to lessen the short channel effect and FIG. 13B shows the characteristics of a threshold voltage of the transistor. FIG. 13A is a cross section of an NMOS transistor using a P-substrate. Although the source and drain electrodes are connected to n+ regions, n– regions to lessen an electric field of the drain are provided on the inner side toward the center of the n+ regions, and p-regions of concentration higher than that of the p– substrate are provided on the inner sides of the n– regions for lessening the electric field of the drain. A PMOS transistor can be also formed by providing regions having impurity concentration lower than that of the drain electrode for lessening the electric field of the drain on the inner sides of the p-type drain electrodes and also n-regions having concentration higher than that of the n-substrate on the inner sides.

The dependence of the threshold voltage $V_{th}$ of such a transistor on the gate length Lg is shown in FIG. 13B. In FIG. 13B, $V_{th}$ denotes a threshold voltage and Vthleak shows a value at which leakage currents occurs, for example, a gate voltage at which the gate width is 1 nA per 1 um. Solid and broken lines correspond to high and low doses of impurities in channels. Although not shown, it is known that $V_{th}$ and Vthleak show characteristics which are almost parallel to each other in a conventional transistor having no p-type region of which concentration is higher than that of the p-substrate. In the transistor having the structure of FIG. 13A, however, the characteristics are different from each other. Vthleak monotonously decreases as the gate length is shortened. On the other hand, $V_{th}$ increases once and then decreases. When the dose of impurities into the channel is changed, both Vthleak and $V_{th}$ shift almost in parallel to each other as shown by the broken lines. The memory cell adapted to a low voltage operation can be formed by using the characteristics as follows.

FIG. 14 shows an eighth embodiment of the invention. It shows that, by using the characteristics of the MOS transistor of FIG. 13A, the characteristics of memory cells of the SRAM and DRAM can be improved more than the embodiment shown in FIG. 8. Each of portions indicated by (a), (b) and (f) can be constructed by a transistor which satisfies the conditions shown in FIG. 13B. By using the transistor (b) in FIG. 13B as the drive MOS transistor in the SRAM memory cell region 3, the threshold $V_{th}$ can be sufficiently high and electric stability is assured. The transistor has the same voltage as the high threshold voltage in the logic circuit. A low threshold voltage in the logic circuit is obtained by a transistor having the same gate length and the same oxide film thickness as those of a high threshold transistor but having a smaller dose of impurities in the channel.

On the other hand, as the transfer MOS transistor in the SRAM, a transistor having a gate length which is made longer a little while decreasing the dose of impurities implanted to the channel as shown by (f) in FIG. 13B is used. Consequently, the threshold voltage can be decreased without changing the leakage currents, and the characteristics of the SRAM can be improved without causing a problem which occurs due to the leakage currents of the transfer MOS transistor in the SRAM as shown in FIG. 4. When the transistor having the structure as shown in FIG. 13A is used and the dose of impurities in the channel is a certain value, it is sufficient to select two gate length values in the region where the leakage currents Vthleak decrease even when the threshold increases. Although the threshold of the transfer MOS transistor is lower than that of the drive MOS transistor, it is sufficient to select a transistor in which Vthleak corresponding to the leakage current is equal to or larger than Vthleak of the drive MOS transistor. In this case, as the transfer MOS transistor, a transistor (f) having a long gate length with the same dose of impurities into the channel as that of the low threshold transistor in the logic circuit can be used.

In a DRAM 141, by using a transistor having the same dose of impurities in the channel and the same gate length as those of the transistor (f) shown in FIG. 13B and having the thickness of a gate oxide film different from that of the transistor (f) shown in FIG. 13B, the DRAM memory cell having suitable characteristics such that the threshold is lowered without increasing the leakage currents can be realized.

Generally, the threshold voltage is defined in two ways. One is a threshold voltage obtained by extrapolation of a saturation current and the other one is a threshold voltage obtained from a gate voltage for passing a constant current in a region where the gate voltage is sufficiently low. The threshold voltage in the invention corresponds to the former one and Vthleak corresponds to the latter one. Although it is written as MOSFET in the specification, a known MISFET can be also used.

According to the invention as described above, in the semiconductor integrated circuit device on which the logic circuit and the memory are integrated, transistors optimum to the operations of the SRAM and DRAM memory cells can be provided without increasing the number of processes.

What is claimed is:

1. A semiconductor integrated circuit device, comprising:
    a dynamic memory cell array, each memory cell having a transfer NMOS transistor and a capacitor,
    a data input and output circuit having a first NMOS transistor, and
    a logic circuit including a second NMOS transistor,
    wherein a thickness of a gate insulating film of the transfer NMOS transistor is greater than a thickness of a gate insulating film of the second NMOS transistor,
    wherein a channel length of the transfer NMOS transistor is greater than a channel length of the second NMOS transistor,
    wherein the thickness of the gate insulating film of the transfer NMOS transistor and the first NMOS transistor is the same, and
    wherein the channel length of the transfer NMOS transistor is larger than a channel length of the first NMOS transistor.

2. A semiconductor integrated circuit device according to claim 1, wherein a voltage supplied to the transfer NMOS transistor and the first NMOS transistor is the same.

3. A semiconductor integrated circuit according to claim 2, wherein the data input and output circuit has a first PMOS transistor, with the same thickness of gate insulating film as the gate insulating film of the transistor NMOS transistor.

4. A semiconductor integrated circuit according to claim 1, wherein the data input and output circuit has a first PMOS transistor, with the same thickness of gate insulating film as the gate insulating film of the transfer NMOS transistor.

5. A semiconductor integrated circuit according to claim 1, wherein the data input and output circuit region surrounds the dynamic memory cell array region.

* * * * *

UNITED STATES PATENT AND TRADEMARK OFFICE
CERTIFICATE OF CORRECTION

PATENT NO. : 7,737,509 B2 Page 1 of 1
APPLICATION NO. : 12/216716
DATED : June 15, 2010
INVENTOR(S) : K. Ishibashi et al.

It is certified that error appears in the above-identified patent and that said Letters Patent is hereby corrected as shown below:

ON THE TITLE PAGE

Please correct (73) Assignee to read as follows:

(73)    ~~Hitachi, Ltd.~~Renesas Technology Corp.,
         Tokyo (JP)

Signed and Sealed this

Thirtieth Day of November, 2010

David J. Kappos
*Director of the United States Patent and Trademark Office*